(12) United States Patent
Michiels et al.

(10) Patent No.: US 8,090,564 B1
(45) Date of Patent: Jan. 3, 2012

(54) AUTOMATIC GENERATION OF TRANSACTION LEVEL BUS SIMULATION INSTRUCTIONS FROM BUS PROTOCOL

(75) Inventors: Tom Michiels, Leuven (BE); Karl Van Rompaey, Nieuwpoort (BE)

(73) Assignee: Synopsys, Inc., Mountain View, CA (US)

( * ) Notice: Subject to any disclaimer, the term of this patent is extended or adjusted under 35 U.S.C. 154(b) by 1015 days.

(21) Appl. No.: 10/700,601

(22) Filed: Nov. 3, 2003

(51) Int. Cl.
*G06F 17/50* (2006.01)
(52) U.S. Cl. ......................................................... 703/13
(58) Field of Classification Search .................... 703/13, 703/22
See application file for complete search history.

(56) References Cited

U.S. PATENT DOCUMENTS

| | | | |
|---|---|---|---|
| 4,051,352 A | 9/1977 | Eichelberger et al. |
| 5,371,746 A | 12/1994 | Yamashita et al. |
| 5,410,685 A | 4/1995 | Banda et al. |
| 5,452,437 A | 9/1995 | Richey et al. |
| 5,790,778 A | 8/1998 | Bush et al. |
| 5,819,093 A | 10/1998 | Davidson et al. |
| 6,083,281 A | 7/2000 | Diec et al. |
| 6,145,099 A | 11/2000 | Shindou |
| 6,418,392 B1 | 7/2002 | Rust et al. |
| 6,516,460 B1 | 2/2003 | Merks et al. |
| 6,587,995 B1 | 7/2003 | Duboc et al. |
| 6,601,229 B1 | 7/2003 | Niederer et al. |
| 6,625,572 B1 | 9/2003 | Zemlyak et al. |
| 6,718,294 B1 | 4/2004 | Bortfeld |
| 6,760,903 B1 | 7/2004 | Morshed et al. |
| 7,133,820 B2 | 11/2006 | Pennello et al. |
| 7,185,319 B2 | 2/2007 | Kaler et al. |
| 2002/0174415 A1 | 11/2002 | Hines |
| 2004/0010778 A1 | 1/2004 | Kaler et al. |
| 2005/0183066 A1 | 8/2005 | Jabori |
| 2006/0069953 A1 | 3/2006 | Lippett et al. |

OTHER PUBLICATIONS

Yun, K. Y., Dill, D.L., "Automatic synthesis of 3D asynchronous state machines", Computer-Aided Design, 1992. ICCAD-92. Digest of Technical Papers., 1992, pp. 576-580.*
Paulin, P., Pilkington, C., and Bensoudane, E. 2002. StepNP: A System-Level Exploration Platform for Network Processors. IEEE Des. Test 19, 6 (Nov. 2002), 17-26. DOI= http://dx.doi.org/10.1109/MDT.2002.1047740.*
Cai, L.; Gajski, D., "Transaction level modeling: an overview," Hardware/Software Codesign and System Synthesis, 2003. First IEEE/ACM/IFIP International Conference on , vol., no., pp. 19-24, Oct. 1-3, 2003.*

* cited by examiner

*Primary Examiner* — Paul Rodriguez
*Assistant Examiner* — Luke Osborne (57) ABSTRACT

Generating transactional level bus simulation instructions from a bus protocol description is disclosed. A bus protocol description is accessed. From the bus protocol description, a finite state machine is generated. Transactional level bus simulation instructions are generated from the finite state machine. Then, the transaction level bus simulation instructions are stored in computer readable medium.

6 Claims, 11 Drawing Sheets

AUTOMATIC GENERATION OF TRANSACTION LEVEL BUS SIMULATION INSTRUCTIONS FROM BUS PROTOCOL

FIELD OF THE INVENTION

Embodiments of the present invention relate to the field of software tools for system level design. Specifically, embodiments of the present invention relate to automatically generating instructions that can be used in a bus simulation. The instructions may be at a transaction level and may be generated from a formal bus protocol description.

BACKGROUND ART

The design and test of modern electronic devices, such as embedded processors (EP) and systems-on-a-chip (SoC) is a complex process involving many stages. For example, many systems, such as mobile devices, networking products, and modems require new embedded processors (EP). These EPs can either be general purpose, such as microcontrollers (µC) and digital signal processors (DSP), or application specific, using application specific instruction set processors (ASIP). Finding a best-in-class solution involves exploring the tradeoff between a general design that is highly flexible and a specific design that is highly optimized. This design exploration phase is conventionally very time consuming; however, given the importance of short product development cycle times, reducing the time required for the design exploration phase is highly significant. The development process of new EPs, SoCs, etc., is separated into several development phases, such as design exploration, software tools design, system integration, and design implementation. In order to facilitate the design process, it is useful have simulators that can simulate hardware and software of the device being designed.

Among the various elements of the overall design are busses, whose architecture must be explored, tested, and verified. The design and test of the bus is a very complex process, as the design of the bus must be explored and tested along with the other components of the EP or SoC. In order to explore and test a bus architecture, it is useful have a bus simulator. A bus simulator may be implemented by manually writing a simulator for the bus. The bus simulator may be used to simulate the bus, along with other elements of the architecture being developed. The simulation allows architecture exploration of the bus design, along with other components of the architecture. The bus simulation also allows testing and verification.

As previously mentioned, simulation may be used to aid in software exploration and testing. For example, a SoC contains a processor for which software may be written. By simulating the SoC (including any busses thereon), software can be written and tested for the SoC while the SoC is still being designed and tested. Thus, the software can be written and tested before the SoC is manufactured.

SUMMARY OF THE INVENTION

Therefore, it would be advantageous to provide a method and system that reduce the time required for the design exploration phase when designing or verifying a bus architecture. It would be further advantageous to provide such a method and system that allow the bus architecture to be explored and tested along with other components of the electronic device of which the bus is a component. It would be further advantageous to provide such a method and system that facilitate testing of software for the electronic device of which the bus is a component. It would be still further advantageous to meet the above constraints while being compatible with existing technologies for developing embedded processors, systems-on-a-chip, and other electronic devices using busses.

Accordingly, embodiments of the present invention provide methods of and systems for automatically generating instructions suitable to use in a bus simulation. The instructions may be at a transactional level and may be generated from a formal bus protocol description. Embodiments in accordance with the present invention reduce the time required for the design exploration phase when designing or verifying a bus architecture. Embodiments in accordance with the present invention allow a bus architecture to be explored and tested along with other components of the electronic device of which the bus is a component. Embodiments in accordance with the present invention facilitate testing of software for the electronic device of which the bus is a component Embodiments in accordance with the present invention meet the above while being compatible with existing technologies for developing embedded processors, systems-on-a-chip, and other electronic devices using busses.

A method and system of generating instructions to simulate a bus by transforming a bus protocol description to the instructions at a transactional level is disclosed. In a computer-implemented method in accordance with an embodiment of the present invention, a bus protocol description is accessed. From the bus protocol description, a finite state machine is generated. Instructions that are suitable to simulate the bus are generated from the finite state machine. The instructions are at a transaction level. Then, the transaction level instructions are stored in computer readable medium. Systems implemented in accordance with the above method are also described herein.

Embodiments of the present invention provide these advantages and others not specifically mentioned above but described in the sections to follow.

DETAILED DESCRIPTION OF THE INVENTION

In the following detailed description of embodiments of the present invention, automatically generating transactional level bus simulation instructions from a bus protocol description, numerous specific details are set forth in order to provide a thorough understanding of the present invention. However, it will be recognized by one skilled in the art that the present invention may be practiced without these specific details or with equivalents thereof. In other instances, well-known methods, procedures, and components have not been described in detail as not to unnecessarily obscure aspects of the present invention.

Notation and Nomenclature

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "executing" or "receiving" or "generating" or "processing" or "computing" or "translating" or "calculating" or "determining" or "compiling" or "returning" or "storing" or "decoding" or "annotating" or "simulating" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Figure 1:
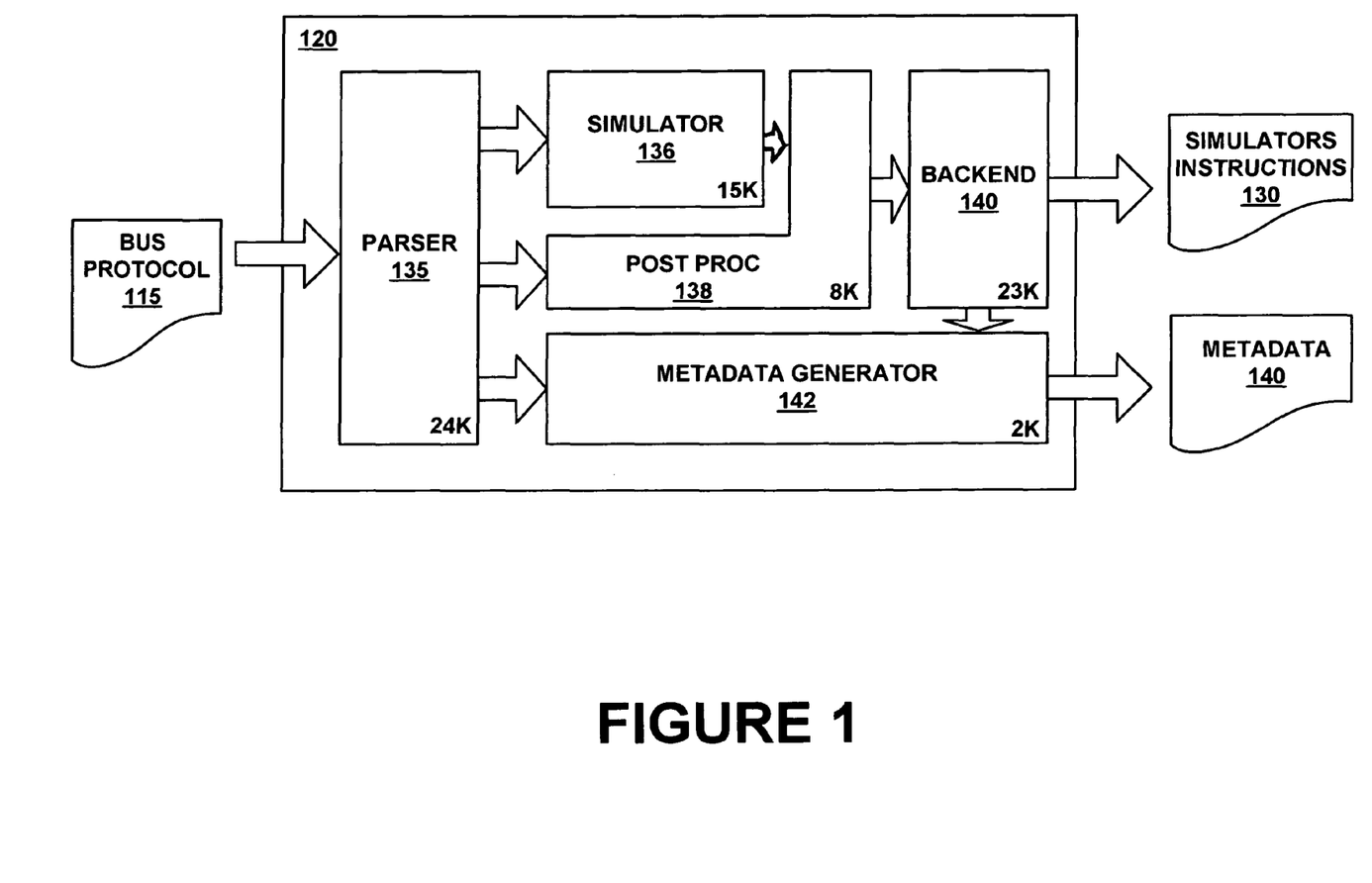
FIG. 1 is a block diagram of components of a bus compiler tool, according to an embodiment of the present invention.

Automatic Generation of a Transaction Level Bus Model from a Bus Protocol Description FIG. 1 is a block diagram of components of a bus compiler tool 120, according to an embodiment of the present invention. The bus compiler tool 120 may be implemented on a general-purpose computer system, such as the computer system 100 depicted in FIG. 11. An input to the bus compiler tool 120 is a description 115 of a formal bus protocol, which will be described in more detail below. The bus compiler tool 120 outputs transactional level bus simulation instructions 130 and a metadata bus description 140. The transaction level bus simulation instructions 130 is not for simulating a specific instance of a bus design, but rather relates to a family of designs for the bus. For example, the transactional level bus simulation instructions 130 do not necessarily specify the exact number of master/slave units. The transactional level bus simulation instructions 130 may be used for architecture exploration, testing, and verification. The metadata bus description 140 may be used to facilitate the aforementioned architecture exploration, testing, and verification. However, the metadata bus description 140 is not a required output of the bus compiler 120.

The bus compiler tool 120 may be described as comprising a number of logical components, which will be described in more detail below. Briefly, the parser 135 reads the input formal bus protocol description 115 and converts it to a format that is suitable for other components of the bus compiler tool 120. The simulator 136 receives an output from the parser 135 and produces a finite state machine based thereon. The post processor 138 receives an input from the parser 135 and an input from the simulator 136 and produces an optimized and transformed finite state machine. The backend 140 receives an output from the post processor 138 and generates the transactional level bus simulation instructions 130. The metadata description generator 142 generates the metadata bus description 140 from an output of the parser 135. The metadata description generator 142 is not a required component of the bus compiler tool 120.

The input formal bus protocol description 115 may be written by a user and may contain temporal expressions, which can describe temporal relationships between events. Temporal expressions are widely known to those of ordinary skill in the art. The input formal bus protocol description 115 may be a general description of the formal bus protocol. For example, the formal bus protocol description 115 may describe the nodes that are part of a family of busses, along with protocol and timing information. However, the formal bus protocol description 115 does not necessarily specify the exact number of master/slaves, the precise topology, the exact memory map, complete arbitration algorithms, etc. This means that the transactional level bus simulation instructions 130 generated by the bus compiler 120 comprises instructions that are general in nature, such that the bus design may be refined by the user during exploration, verification, and testing. The formal bus protocol description 115 may be a text file or a graphical description. The parser 135 may be designed to be able to parse formal bus protocol descriptions 115 in a textual format, a graphical format, or another format.

As previously discussed, the bus compiler tool 120 outputs two files 130, 140, in this embodiment. One file is a transactional level bus simulation instructions 130 of the bus. The transaction level may be described as an abstraction away from the physical hardware (e.g., MUXes, registers, electrical connections) up to a level at which transactions over the bus are considered. The transactional level bus simulation instructions 130 may be used by another tool (not depicted in FIG. 1) to explore the architecture. For example, the Platform Creator Tool™, commercially available from CoWare™ of San Jose, Calif. may be used to simulate a bus by inputting the transactional level bus simulation instructions 130.

As previously mentioned, the transactional level bus simulation instructions 130 may be general in nature. For example, the transactional level bus simulation instructions 130 do not necessarily represent a specific instance of a bus. Therefore, various parameters can be adjusted during design exploration and testing of the bus design. For example, a user can choose the number of master/slaves, the type arbitration, etc. Thus, a user may create a specific instance of a bus design from a general transaction level bus description 130. The transactional level bus simulation instructions 130 may be substantially compliant with the SystemC programming language, although other programming languages are also suitable for the transactional level bus simulation instructions 130.

The bus compiler 120 is capable of producing a cycle accurate transactional level bus simulation instructions 130, in various embodiments. In order to produce cycle accurate transactional level bus simulation instructions 130, the formal bus protocol description 115 must meet certain constraints. However, it is not required that the formal bus protocol description 115 meets these constraints, in which case the transactional level bus simulation instructions 130 will not be cycle accurate.

The bus compiler 120 also outputs, in this embodiment, a metadata description 140 of the bus that may be used to facilitate the aforementioned modifications to the bus design. In one embodiment, the metadata bus description 140 contains information on different nodes, configuration options for the nodes, constraints on memory maps, and different arbitration schemes and priority thereof. The metadata bus description 140 may be used by another tool (not depicted in FIG. 1) to allow the user to configure the bus design from the simulation produced from the transactional level bus simulation instructions 130. For example, the Platform Creator Tool™, commercially available from CoWare™ of San Jose, Calif. may be used to configure or refine the bus design. The metadata bus description 140 may be used by the Platform Creator Tool™, or the like, in order to present a GUI (Graphical User Interface) to the user. The user may modify the bus design by interacting with the GUI. The metadata bus description 140 is substantially compliant with the XML (Extensible Markup Language) language, in one embodiment. The metadata bus description 140 described in this paragraph is not a requirement of the present invention.

As previously mentioned, the formal bus protocol description 115 that is an input to the bus compiler tool 120 may be a text file, although the formal bus protocol description 115 does not have to be a text file. Table I is an exemplary text file formal bus protocol description, in accordance with an embodiment of the present invention. The exemplary text file formal bus protocol description may be written by a user. The present invention is not limited to any specific language in which to describe the text file formal bus protocol description. Moreover, the present invention is not limited to the formal bus protocol description 115 being a text file.

TABLE I

```
commands = {
variable setup,
type = bool,
compute = (addrTrf.sent & addrTrf.type = =readAtAddress);
variable enable,
type = bool,
compute = delay (setup);
use addrTrf,
configurators = {
sendTransaction = currentTransaction,
receiveTransaction = currentTransaction,
canSend = !enable,
canReceive = delay (setup)
},
attributes = {
restrict type,
values = {idle, readAtAddress, writeAtAddress};
};
use readDataTrf,
configurators = {
```

TABLE I-continued

```
sendTransaction = currentTransaction,
receiveTransaction = currentTransaction,
canSend = enableRead,
canReceive = delay (enableRead)
};
decoder_api decoder,
sensitivity = setup;
```

The formal bus protocol description defines the relation over time of events coming in and going out the bus. For example, an input in the formal bus protocol description may be an address send, which modifies the state of the bus. The formal bus protocol description may also specify when decoding takes place. In the example of Table I, there are two transfer types. A transfer is defined herein as a part of a transaction that is performed over a bus and, in general, is the largest possible sub-part of a transaction that is unidirectional. The transfer may go from, for example, a master to a slave, a slave to a master, a master to a bus, a bus to a master, a slave to a bus, or the bus to a slave. This may be a transfer of an address, data, or a control signal, for example.

In the example of Table I, a first transfer type is an address transfer, as defined by lines following the "use addrTrf" heading. A second transfer type is a read data transfer, as defined by lines following the "use readDataTrf" heading. The term "use" is a command that is used to specify the behavior of the protocol being implemented. The term following "use" is the name of the transfer used by the protocol.

In order to allow pipelining, the exemplary description has the lines with the terms "sendTransaction" and "receiveTransaction." The term "currentTransaction," which follows specifies where in the pipeline the transaction belongs. The pipelining will be discussed in greater detail below. The "canSend" and "canReceive" terms define when the transfer can be sent or received by the initiator (e.g., master) or target (e.g., slave) port. During simulation, the value of "canSend" and "canReceive" are used to determine when trigger bus simulator events "sent" and "receive" can be triggered. The command "decoder_api" defines when the address decoder is triggered. In this example, the decoder is triggered when the variable "setup" is true.

Continuing with the description of the exemplary formal bus protocol description of Table I, two variables, "setup" and "enable" are defined to be of type Boolean. The variable "setup" is defined as the expression "addrTrf.sent & addrTrf.type==readAtAddress." In this expression, to denote an address transfer, the user has defined the name "addrTrf." The variable "enable" is defined in the exemplary formal bus protocol description as a delay of the variable "setup." The "delay" operator allows a variable or expression to be registered, such that a state achieved.

Figure 2:
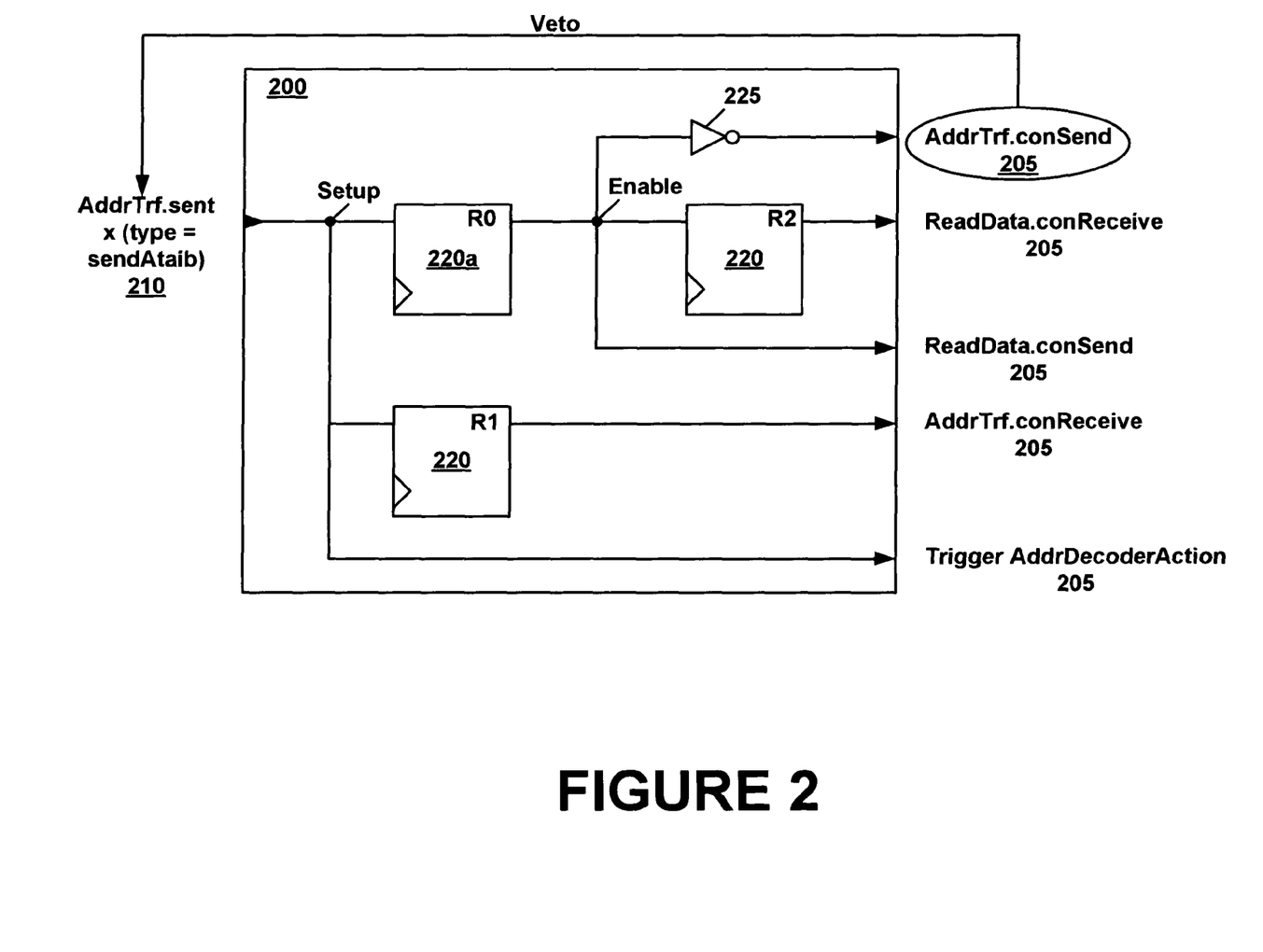
FIG. 2 is a diagrammatic representation of exemplary input to a bus compiler in accordance with an embodiment of the present invention.

As previously mentioned, the formal bus protocol description may be of various formats, including but not limited to, textual and graphical format. FIG. 2 is a diagrammatic representation 200 of exemplary formal bus protocol description in accordance with an embodiment of the present invention. The diagrammatic representation 200 may be derived from the exemplary test file formal bus protocol description of Table I. In one embodiment in accordance with the present invention, the parser (135, FIG. 1) generates the diagrammatic representation 200 and outputs it to the simulator (136, FIG. 1).

On the right-hand side of the diagrammatic representation 200 are five outputs 205, which are used by the simulator 136. On the left-hand side of the diagrammatic representation 200 is an input 210. There may be any number of inputs 210 and outputs 205. The diagrammatic representation 200 also contains logic. In this case, the logic comprises a number of registers 220, which perform a delay. As previously discussed, the "delay" operator allows a variable or expression to be registered. The registers 220 delay a variable or expression for a fixed number of clock cycles. In this case, the variables being delayed are the variables "setup" and "enable," which are defined in Table I. The logic also comprises an inverter 225, in this example.

The logic is suitable to perform whatever function is suitable to model the formal bus protocol description. Thus, for example, the logic is suitable to implement whatever combinatorial expression may be used in the formal bus protocol description. For example, the variable "enable" is the output of register 220a, which has as its input the variable "setup." Thus, this corresponds to the definition of the variable "enable" in Table I. As a further illustration, the output "AddrTrf.cansend", which defines when an address transfer can be sent, is formed by passing the "enable" signal through the inverter 225. Referring to Table I this reflects the line "canSend=!enable." The other outputs 205 of the diagrammatic representation 200 are formed in a similar fashion.

Figure 3:
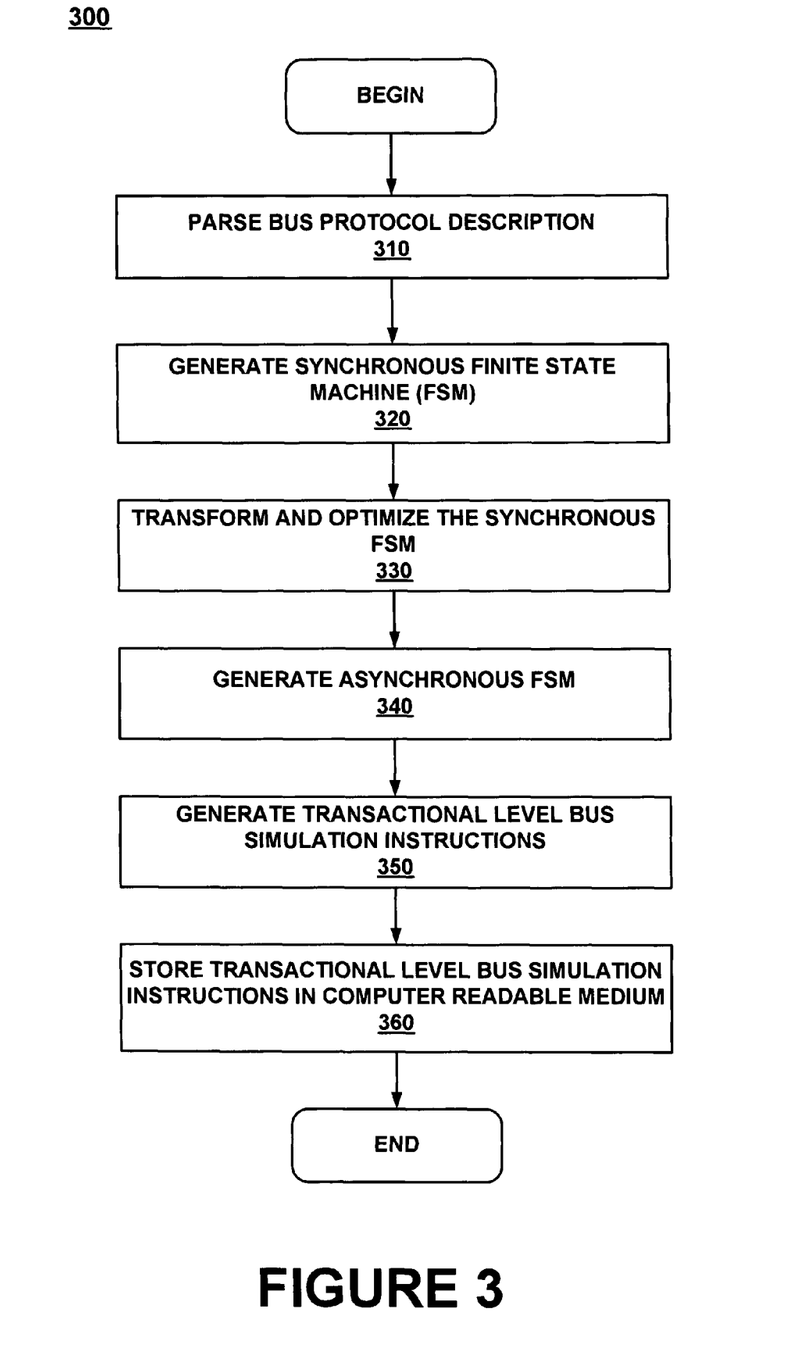
FIG. 3 is a flowchart illustrating a computer-implemented process of generating a bus model from a bus protocol, in accordance with an embodiment of the present invention.

FIG. 3 is a flowchart illustrating a computer-implemented process of generating transactional level bus simulation instructions. Steps of process 300 of FIG. 3 may be stored as instructions in a computer readable medium. The instructions may be executed on a general-purpose processor. Thus, computer system 100 of FIG. 11 may serve as a platform upon which to practice process 300.

FIG. 3 will be discussed in conjunction with FIGS. 1-2 and FIGS. 4-7. Step 310 in the process 300 is to parse a formal bus protocol description to generate a description that is suitable to derive a finite state machine (FSM) therefrom. For example, a textual file formal bus protocol description may be parsed by the parser (135, FIG. 1) to generate a diagrammatic representation (200, FIG. 2) of the bus. However, the formal bus protocol description does not have to be in textual format.

Figure 4:
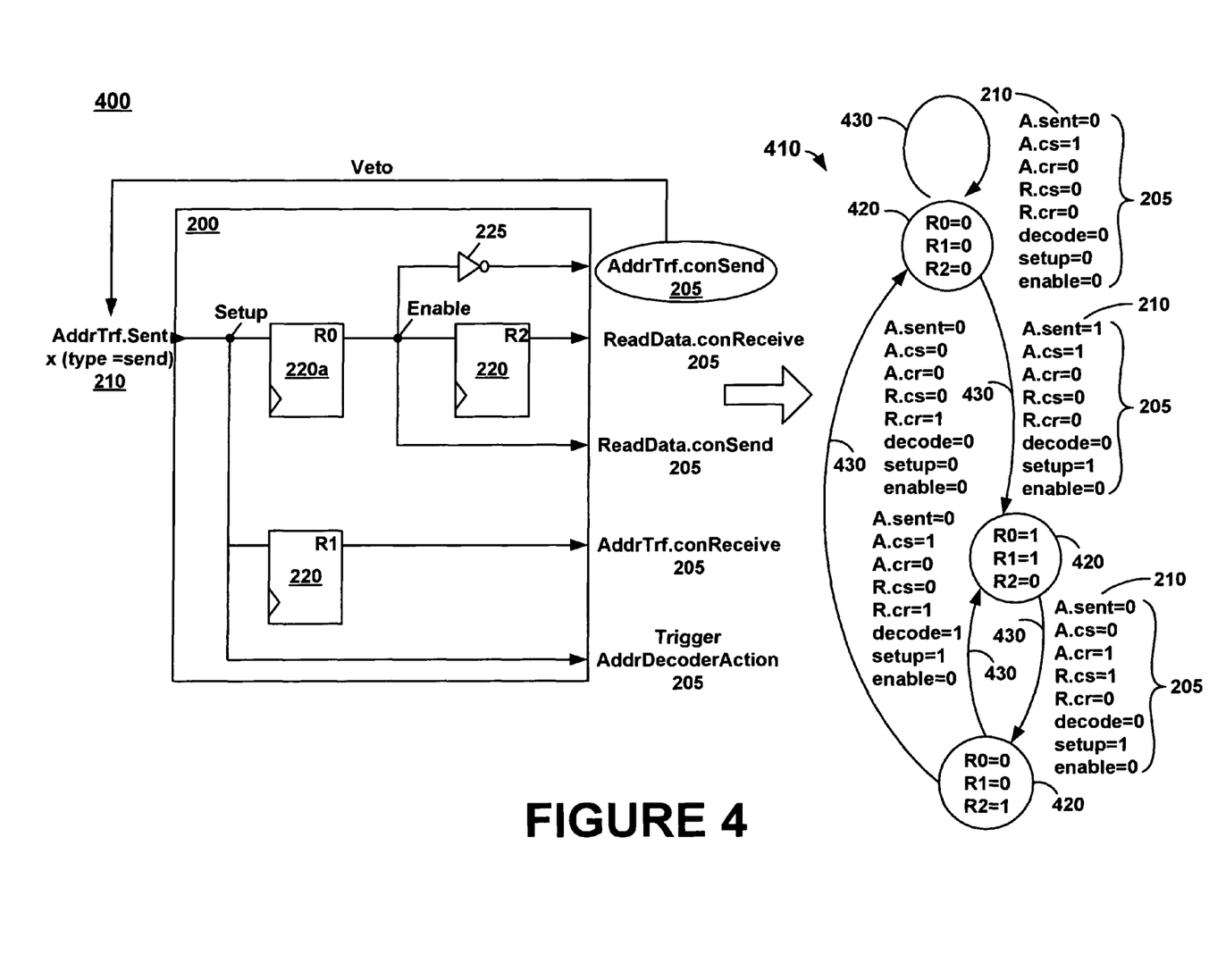
FIG. 4 is a diagram of an exemplary finite state machine generated from an exemplary input, in accordance with an embodiment of the present invention.

Step 320 in the process 300 of FIG. 3 is to generate a synchronous finite state machine (FSM) based on the description generated in step 320. In one embodiment in accordance with the present invention, step 320 is performed by the simulator (136, FIG. 1), based on output of the parser (135, FIG. 1). FIG. 4 is a diagram 400 of an exemplary synchronous finite state machine (FSM) 410 generated from an exemplary diagrammatic representation 200 of an input formal bus protocol, in accordance with an embodiment of the present invention.

As previously discussed, the diagrammatic representation 200 comprises a number of registers 220. For every combination of registers 220, there is a state 420 in the synchronous FSM 410. Referring to the FSM 410, the various states 420 each contain a value for each of the registers from the dataflow diagram 200. For example, the states 420 contain values for registers "R1", "R2", and "R3". As previously mentioned, the registers 220 relate to the delay as described in the formal bus protocol description (e.g., Table I). The synchronous FSM 410 also comprises transitions 430 from one state 420 to the next state 420 (or from one state 420 to itself). In FIG. 4, the transitions 430 of the synchronous FSM 410 are annotated with values for the input(s), outputs, and variables. In this example, the input 210 is "A.sent," which is shorthand for "addrTrf.sent & addrTrf.type==readAtAddress." The outputs 205 are "A.cs", which is shorthand for "AddrTrf.cansend", "A.cr", which is shorthand for "AddrTrf.canreceive", "R.cs", which is shorthand for "ReadData.cansend", "R.cr", which is shorthand for "ReadData.canreceive", and "decode", which stands for "triggerAddrDecoderAction". The variables annotated on the transitions 430 are setup and enable.

Figure 5:
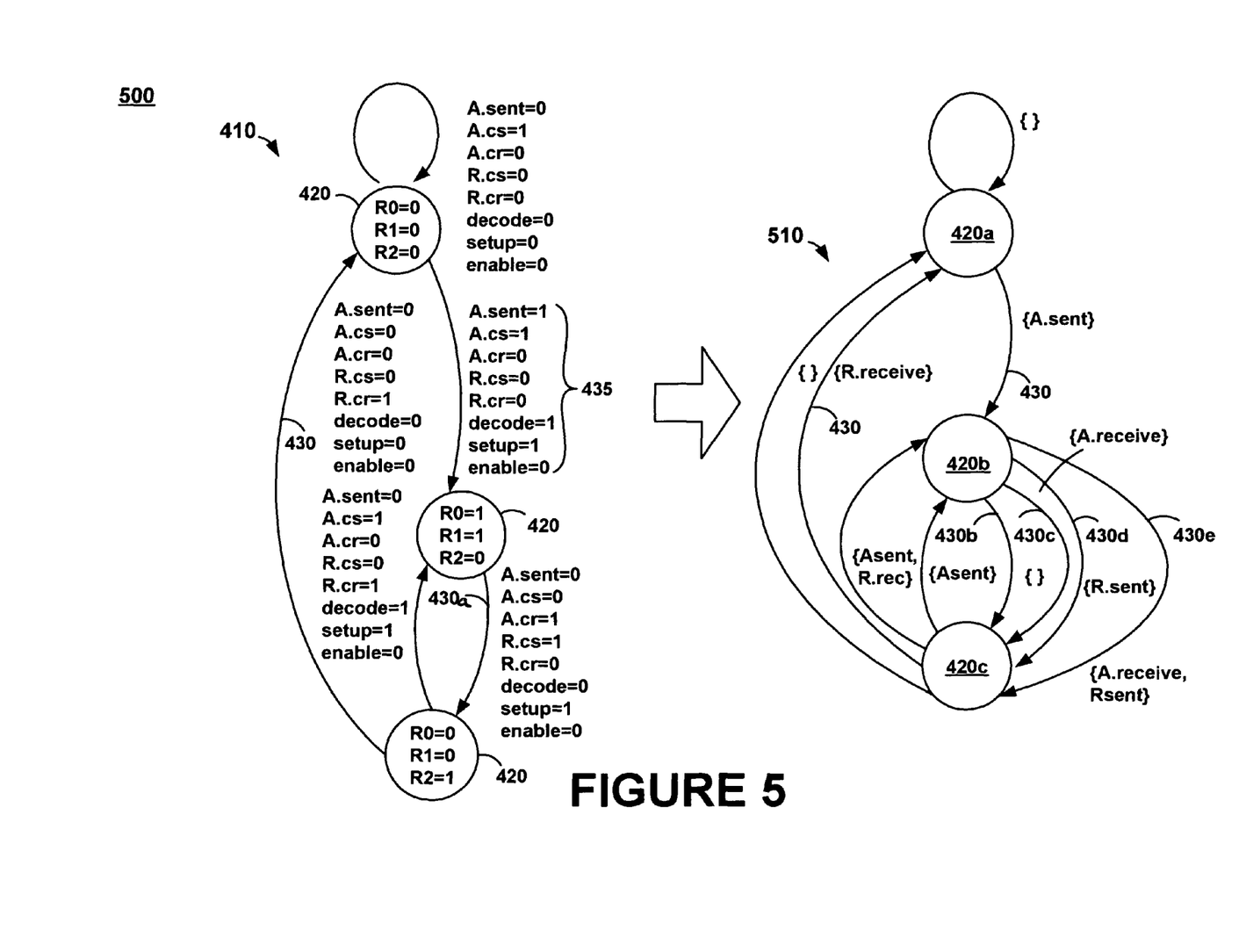
FIG. 5 is a diagram of an exemplary transformed finite state machine having added transitions, in accordance with an embodiment of the present invention.

Step 330 in the process 300 of FIG. 3 is to transform and optimize the synchronous FSM. The transformation and optimization step will be explained by describing FIG. 5 and FIG. 6. However, in actual practice the FSM illustrated in FIG. 5 does not need to be produced. The FSM illustrated in FIG. 5 is shown for purposes of clarifying step 330. Thus, the FSM illustrated in FIG. 5 should not be understood to be a necessary sub-step of step 330, but rather as a vehicle to understand step 330.

FIG. 5 is a diagram 500 of an exemplary transformed FSM 510, which may be derived from the synchronous FSM 410. The transformed FSM 510 contains the same number of states 420 as the synchronous FSM 410, but has additional transitions 430. The additional transitions 430 arise from additional inputs that were not specified in the formal bus protocol description from which the state diagrams were derived, but that could have been specified had the writer of the formal bus protocol description choose to do so. That is the writer of the formal bus protocol description does not necessarily use all of the inputs that are available to be used when writing the formal bus protocol description. For example, the synchronous FSM 410 has only one input {A_sent}. However, the transformed FSM 510 of FIG. 5 factors in all possible inputs.

For purposes of illustrating the previous point, the following discussion of some of the transitions 430 is presented. It is noted that the transition 430a in the synchronous FSM 410 expands to four transitions 430b-e in the transformed FSM 510. That is, in this example there are four transitions 430 between state 420b and state 420c. Those four transitions 430b-e are annotated as { }, {Areceive}, {Rsent}, and {Areceive, Rsent}. The elements within the brackets "{ }" are events. The four transitions 430b-e correspond to the four possible combination of the two events "Areceive" and "Rsent." Those events relate to an address receive and a read sent, respectively. More particularly, the events relate to the outputs "A.cr" and "R.cr" that are annotated by transition 430a in the synchronous FSM 410. The output "A.cr" indicates that an address can be received and the output "R.cs" indicates that data can be sent. Those two outputs are of interest because their value is "1" for that transition 430a and are thus valid events. The four transitions 430b-430e relate to the four possible combinations of these two events. Based on this example, one of ordinary skill in the art will appreciate how the transitions 430 from state 420c to states 420b and 420a are derived.

The finite state machines in accordance with embodiments of the present invention can have thousands of states 420. The large number of states 420 allows the generation of transactional level bus simulation instructions that are much more efficient than practical if the transactional level bus simulation instructions were to be manually written. For example, if the transactional level bus simulation instructions were manually written, to produce the correct output very complex expressions in terms of the state variables and inputs would need to be written. Writing such complex expression results in a simulation based on the transactional level bus simulation instructions that require more reads and writes to variables and more computation of variables than is required by embodiments of the present invention. Thus, embodiments of the present invention produce a more efficient simulation than a simulation based on manually written transactional level bus simulation instructions.

Figure 6:
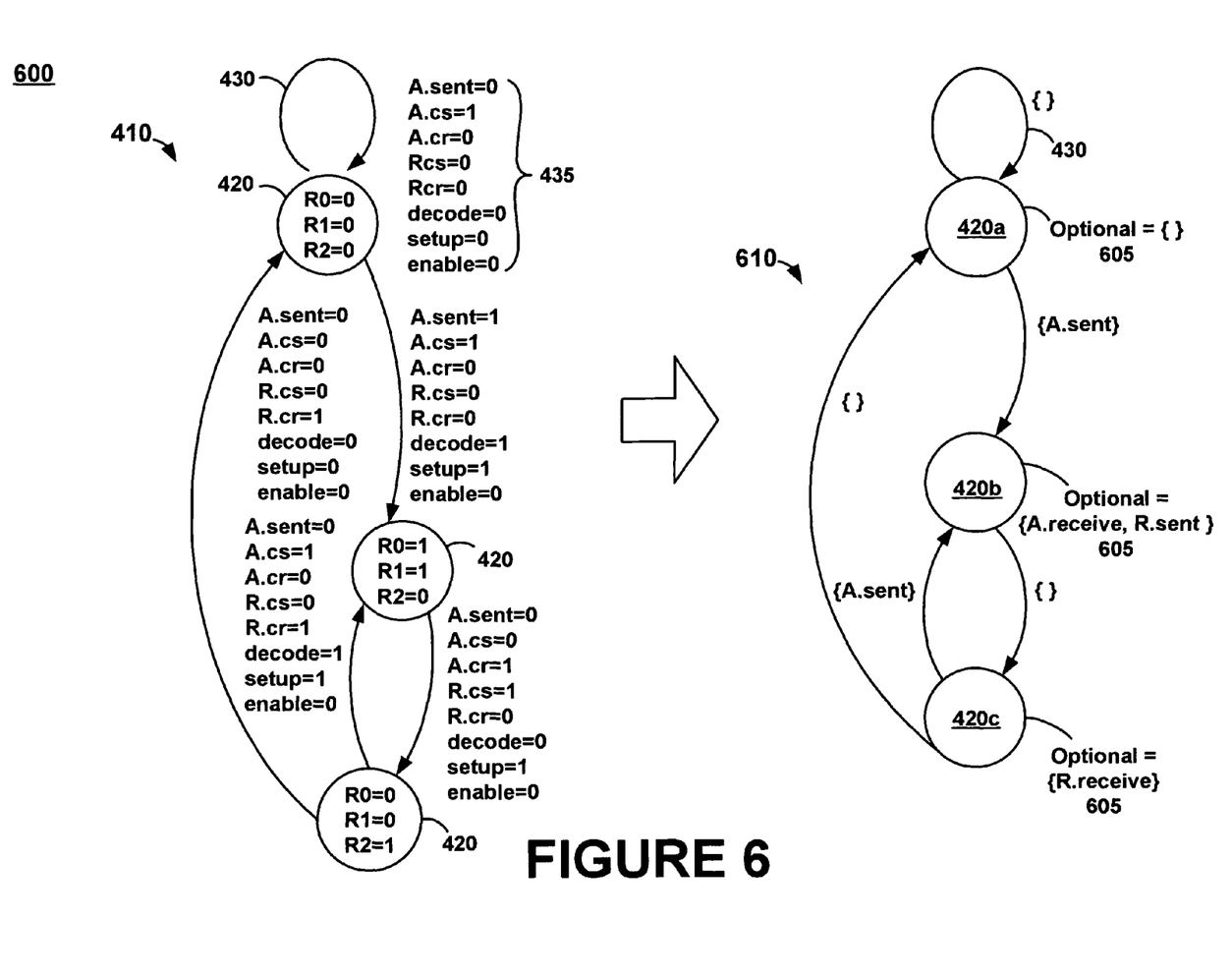
FIG. 6 is a diagram of an exemplary optimized finite state machine annotated with optional events, in accordance with an embodiment of the present invention.

Continuing with the explanation of step 330 of process 300, FIG. 6 is a diagram 600 of an exemplary optimized FSM 610 derived from a synchronous FSM 410, in accordance with an embodiment of the present invention. The optimization allows certain transitions 430 to be removed from the finite state machine. The optimized FSM 610 can be derived directly from the synchronous FSM 410 generated in step 320. Thus, as previously discussed, it is not necessary to generate the transformed FSM 510 of FIG. 5 in order to generate the optimized FSM 610 of FIG. 6. In the optimized FSM 610 of FIG. 6, events that do not influence the direction of the transitions 430 are annotated on the state 420 in the optimized FSM 610 as optional events rather that expanded in transitions 430. For example, state 420a is annotated with an optional event 605 "optional={ }", state 420b is annotated with an optional event 605 "optional={Areceive, Rsent}," and state 420c is annotated with optional event 605 "optional={Rreceive}."

Moreover, transitions 430 associated with the optional events need not be included in the optimized FSM 610. Thus, there are substantially fewer transitions 430 in the optimized FSM 610 of FIG. 6 than there are in the transformed FSM 510 of FIG. 5. For example, referring to step 420b in the optimized FSM 610, the events "Areceive" and "Rsent" are optional event for that state 420b. Thus, the only transition between state 420b and 420c is the transition with the empty set { }. In contrast, the transformed FSM 510 of FIG. 5 shows four transitions 430 between states 420b and 420c, those transitions involving the events "Areceive" and "Rsent". By encoding or annotating the states 420 in the optimized FSM 610 with optional events, the transactional level bus simulation instructions that are generated is more efficient.

Figure 7:
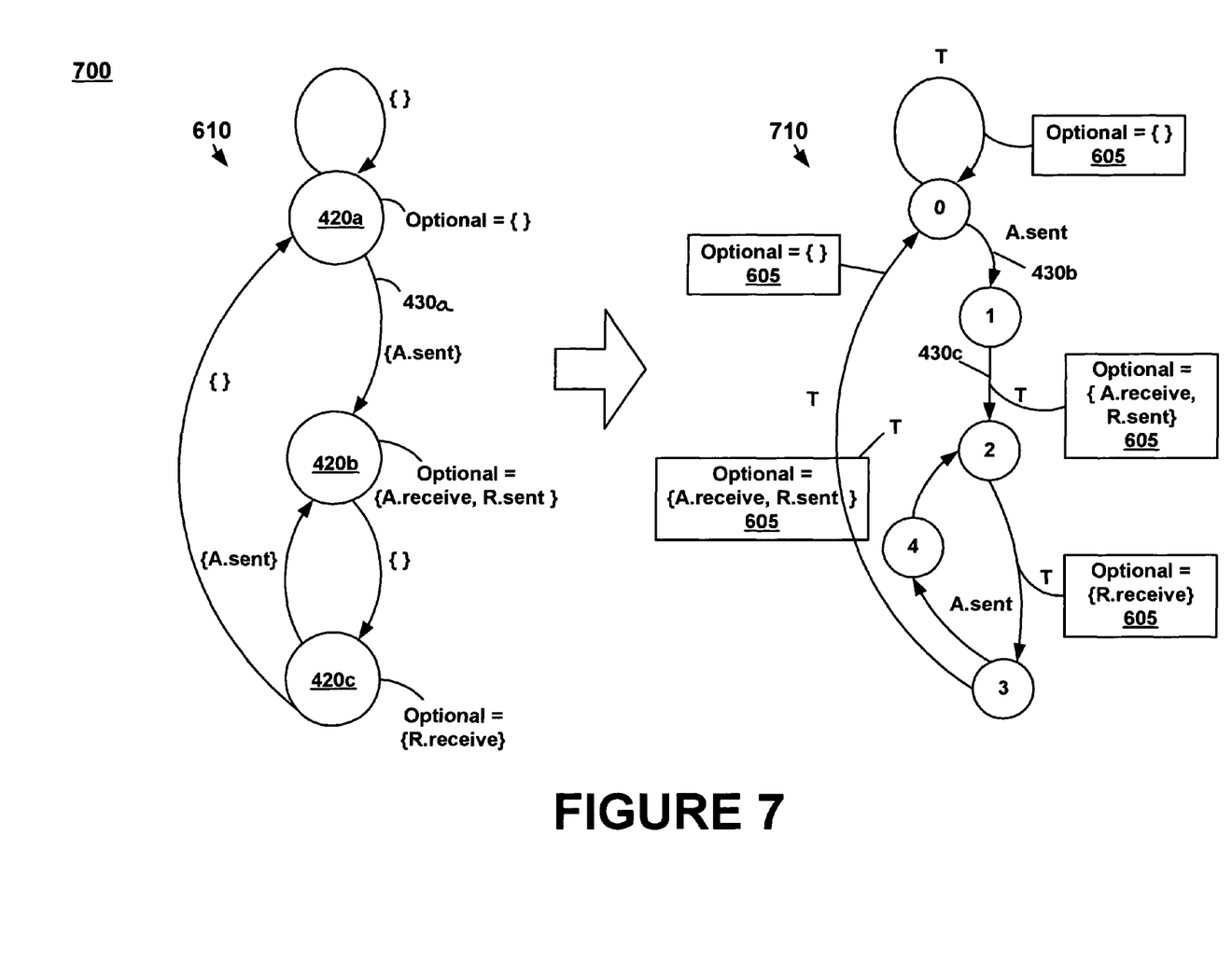
FIG. 7 is a diagram of an exemplary asynchronous finite state machine, in accordance with an embodiment of the present invention.
Figures 8A, 8B, 8C:
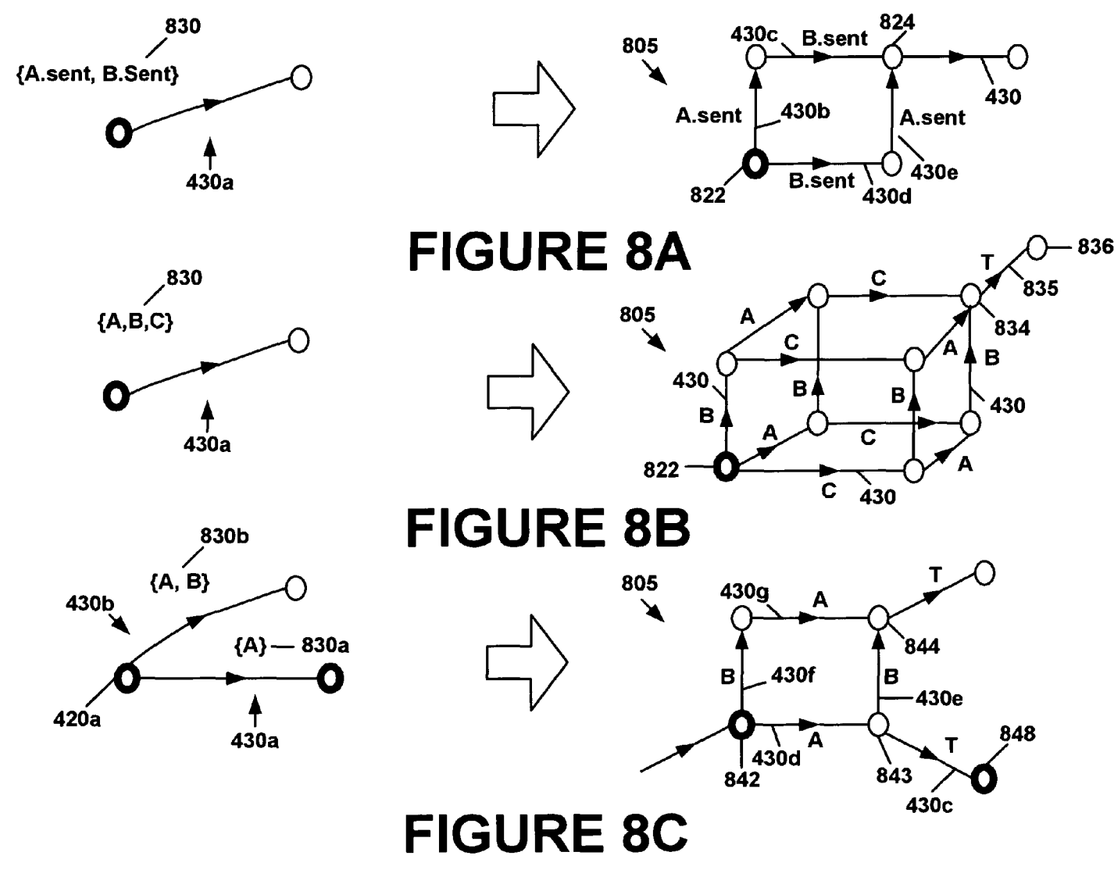
FIG. 8A, FIG. 8B, and FIG. 8C are exemplary hypercubes, in accordance with embodiments of the present invention.

Step 340 in the process 300 of FIG. 3 is to generate an asynchronous FSM. In this step 340, transitions are expanded into a "hypercube" of event transitions connected to a "time transition." Thus, there are additional states 420 in the asynchronous FSM. FIG. 7 is a diagram 700 of an exemplary asynchronous FSM 710 produced from the optimized FSM 610, in accordance with an embodiment of the present invention. In this step 340, every transition 430 in the optimized FSM 610 is expanded into a "hypercube" of event transitions connected to a "time transition." For example, transition 430a in the optimized FSM 610 is expanded to a hypercube comprising, in this case, a single event transition 430b followed by the time transition 430c. FIGS. 8A-8C illustrate more complex examples of hypercube generation, according to embodiments of the present invention.

Referring again to FIG. 7, the optional events 605 remain as annotations. However, whereas it is the states 420 that are annotated in the optimized FSM 610, it is the time transitions 430 that are annotated with optional events 605 in the asynchronous FSM 710. In the asynchronous FSM 710, there is one transition 430 per event.

FIGS. 8A, 8B, and 8C illustrate examples of hypercubes, in accordance with embodiments of the present invention. In FIG. 8A, a transition 430a having an event set 830 with two events is transformed into a hypercube 805 with two paths and a time transition 430. Each path goes from state 822 to state 824 and defines one of the two possible combinations of the events. Thus, each path defines one of the sequences of events in the event set 830 associated with the transition 430a that is possible. Thus, one path comprises a transition 430b for the event "A_sent" followed by a transition 430c for the event "B_sent" and the second path comprises a transition 430d for the event "B_sent" followed by a transition 430e for the event "A_sent". There is also a time transition 430f between state 824 and the time state 826.

Continuing with the discussion of the hypercubes 805, in FIG. 8B, a transition 430a having an event set 830 with three events {A, B, C} is transformed into a hypercube 805 having six paths between state 832 and state 834. Each path comprises three transitions 430 and defines one of the six possible combinations of the three events. Thus, the six paths are paths "ABC," "ACB," "BAC," "BCA," "CAB," and "CBA." There is also a time transition 835 from state 834 to the time state 836.

Continuing with the discussion of the hypercubes 805, in FIG. 8C an example is provided featuring two transitions 430a, 430b from a single state 420a, wherein there is an overlap between the events in the event sets 830a, 830b in the two transitions 430a, 430. One event set 830b contains two events {A, B} and the other event set 830a contains only the event {A}. The hypercube 805 in this example contains three paths, which is all the possible paths given the events. One path in the hypercube 805 goes from state 842 to state 843 and represents the transition 430a with the event set 830a with the single event {A}. The state 843 of the hypercube 805 has a time transition 430c to a time state 848. There are two additional paths in the hypercube 805, one for each of the two possible combinations of all events in the event set 830b of transition 430b. Each path goes from state 842 to state 844 and defines one of the two possible combinations of the events. Thus, one path comprises the transition 430d corresponding to event "A" followed by the transition 430e corresponding to event "B." The second path in the hypercube 805 comprises the transition 430f corresponding to event "B" followed by the transition 430g corresponding to event "A".

The hypercubes 805 allow the generation of instructions that allows very efficient evaluation of the behavior of the bus. Each hypercube 805 takes into account all possible sequences of events that may occur at the same time. In the simulation, the events cannot trigger at exactly the same time assuming only one processor is used to run the simulation. Conventionally, a type of signal is used to overcome this limitation of simulated events in a processor. A conventional signal of this type is variables that only changes its content when the time being simulated is advanced. The hypercube 805 in accordance with an embodiment of the present invention takes into account all possible combinations of the sequencing of the events. This alleviates the need for using signals in the simulation, along with its attendant complexity.

Step 350 of process 300 of FIG. 3 is to generate transactional level bus simulation instructions from the asynchronous FSM. Table II illustrates exemplary transactional level bus simulation instructions, in accordance with an embodiment of the present invention. The instructions in Table II may be generated from an asynchronous FSM.

TABLE II

```
const int optAdrrRec = 1;
const int optRDataSend = 2;
const int optRDataRec = 4;
class APBNode {
private:
struct StateStruct {
int timeTransition;
int addressTransition;
unsigned int optionalEvents;
}
const static StateStruct table[5];
StateStruct* state;
unsigned int optionalState;
public:
void tickTime ( ) {optionalState = state->optionalEvents; state = table[state->timeTransition];}
bool canSendAddrTrf( ) {return (state->addressTransition >=0); }
void sendAddrTrf( ) {state = table[state-> addressTransition [; }
bool can ReceiveAddrTrf( ) {return (optionalState & optAdrrRec);}
bool canSendReadDataTrf( ) {return (optionalState & optRDataSend);}
```

TABLE II-continued

```
void sendReadDataTrf( ) {optionalState -= optRDataSend;}
bool canReceiveReadDataTrf( ) { return (optionalState & optRDataRec);}
}
const static APBNode:: StateStruct APBNode:: table[5] = {
{0,1,0},
{2, -1, optAddrRec | optRDataSend},
{3, -1, optRDataRec},
{0, 4, 0},
{2, -1, optAddrRec | optRDataSend}
```

The transactional level bus simulation instructions are written in C++ in this example. However, the present invention is not limited to the programming language C++ or variants thereof. In order to generate the transactional level bus simulation instructions, the asynchronous FSM (710, FIG. 7) is transformed into a table that contains a full description of the asynchronous FSM 710. There is a line in the table for each of the transitions. The TLM bus model interacts with API calls to the busses, master, and slaves.

Step 360 of process 300 of FIG. 3 is to store the generated transactional level bus simulation instructions in a computer readable medium. These instructions may be output, such that they are available to perform a simulation of the bus. The process 300 then ends. As previously discussed, the transactional level bus simulation instructions may be used to perform a simulation of the bus being modeled if the transactional level bus simulation instructions are input to a suitable tool.

Figure 9:
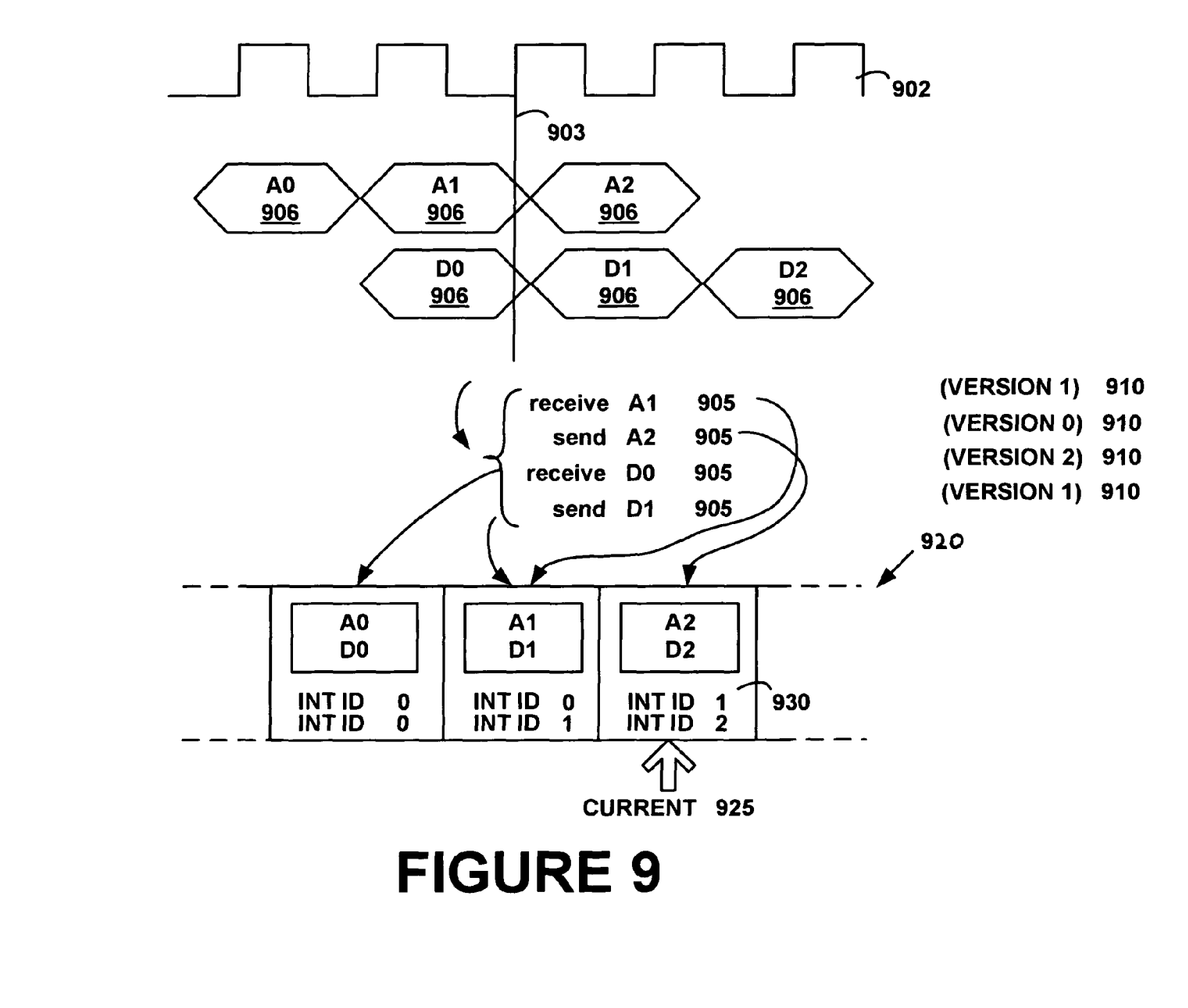
FIG. 9 is a diagram illustrating pipelined transactions, in accordance with an embodiment of the present invention.

Embodiments of the present invention are able to generate transactional level bus simulation instructions that handle pipelined instructions. FIG. 9 is a diagram illustrating pipelined transactions, in accordance with an embodiment of the present invention. FIG. 9 illustrates a simple pipelined protocol with no wait states. In this case, there are three transactions, each with an address transfer and a data transfer. The various transfers 906 (e.g., A0-A2 and D0-D2) each have two events 905. The events 905 that occur at the current edge 903 of the clock 902 are shown. For example, the address transfer has an address send event 905 and an address receive event 905.

In order to keep track of what entity (e.g., master, slave, bus) can send or receive one of the transfers 905, a version 910 is attached to each event 905. Thus, the versions 910 allow an embodiment of the present invention to model a bus having pipelining. In FIG. 9 a version of "0", "1", or "2" is attached to the events 905, indicated at what point in the pipeline sequence the event 905 belongs. For example, events "receive A1" and "send D1" have "version 1" attached to them to indicate their position in the pipeline.

FIG. 9 also shows a circular queue 920 with a current pointer 925, which points to the current transaction 930. The current transaction contains the address and data transfers "A2" and "D2," respectively. Moreover, the current transaction 930 contains a master ID and a slave ID, which indicate the entities that may send or receive a transfer associated with the current transaction 930. Finally, any of the finite state machines may be annotated with the version numbers, such that the information is encoded into the finite state machines. By then consulting the circular buffer, the state of the pipeline is determinable.

Table III illustrates an exemplary formal bus protocol description having pipelining, in accordance with an embodiment of the present invention. The exemplary formal bus protocol description is similar to the example illustrated in Table I, and as such, will only be described briefly. The exemplary formal bus protocol description contains a line indicating when the current pointer (925, FIG. 9) will be shifted. This line reads, "pipeShift=true". While this is a very simple expression, more complex expression are within the scope of the present invention. The transaction to which a transfer belongs is specified by the formal bus protocol description. For example, the lines following "use addrTrf" define a transaction for an address transfer. The address transfer transaction comprises a send transfer and a receive transfer, as indicated by the lines "sendTranaction" and "receiveTranscation." Each of these lines indicates that the transfers are associated with the current transaction. In contrast, the transaction for reading data is associated with the previous transaction. For example, the lines following "use readDataTrf" define a read data transfer. As depicted in Table III, the "sendTransaction" and the "receiveTransaction" are specified as be associated with "previousTransaction."

TABLE III

```
Configurators = {
PipeShift = true;
},
commands = {
variable addressBusy,
type = bool,
compute = (addrTrf.sent & addrTrf.type = =readAtAddress);
variable dataBusy,
type = bool,
compute = delay (addressBusy);
use addrTrf,
configurators = {
sendTransaction = currentTransaction,
receiveTransaction = currentTransaction,
canSend = true,
canReceive = dataBusy
},
attributes = {
restrict type,
values = { readAtAddress};
};
variable previousTransaction,
type = transaction,
compute = delay (currentTransaction);
use readDataTrf,
configurators = {
sendTransaction = previousTransaction,
receiveTransaction = previousTransaction,
canSend = dataBusy,
canReceive = delay (dataBusy)
};
decoder_api decoder,
sensitivity = addressBusy;
};
};
```

Figure 10:
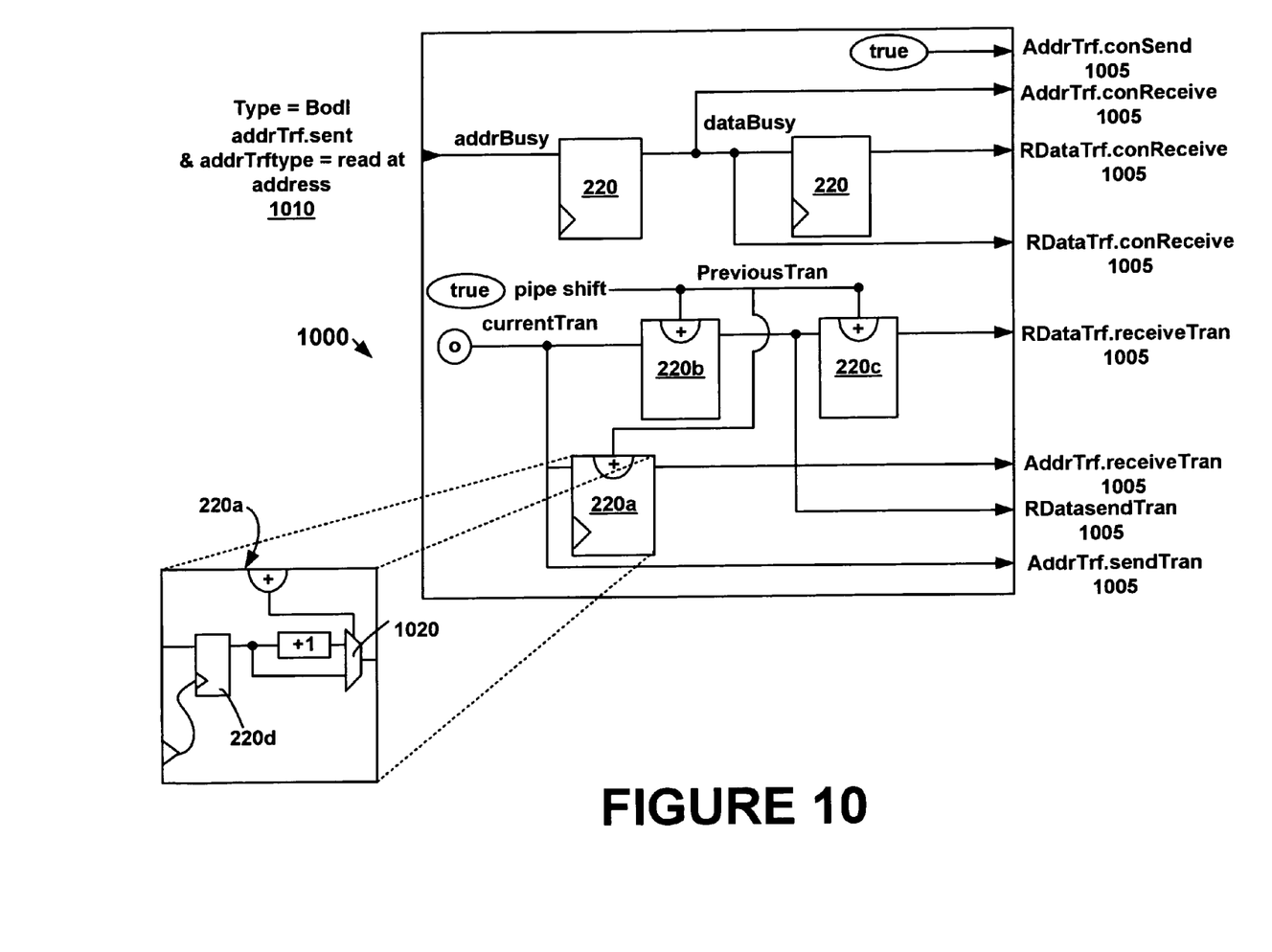
FIG. 10 is a diagrammatic representation of an exemplary bus with pipelining used for input to an embodiment of the present invention.

FIG. 10 illustrates an exemplary diagrammatic representation 1000 of the exemplary pipelined formal bus protocol description of Table III. The parser (135, FIG. 1) may generate such a diagram for use as input to the simulator (136, FIG. 1). The exemplary diagrammatic representation 1000 has a number of outputs 1005 and an input 1010, which can be derived form a study of the exemplary pipelined formal bus protocol description of Table III. Registers 220*b* and 220*c* have as input the variable "currentTran", which refers to currentTransaction in Table III. Register 220*c* has as input the variable "previousTran, which refers to previousTransaction in Table III. The variable "pipeshift" is input to several of the registers 220*a*-220*c*.

One of the registers 220*a* in FIG. 10 is illustrated with details showing an internal register 220*d* and a MUX 1020. Registers 220*b* and 220*c* may be configured in a similar fashion. The MUX 1020 has as inputs the output of the internal register 220*d* and that value incremented by "1". The variable "pipeshift" selects the value passed by the MUX 1020. Thus, value of pipeshift is used to control the pipeline.

Figure 11:
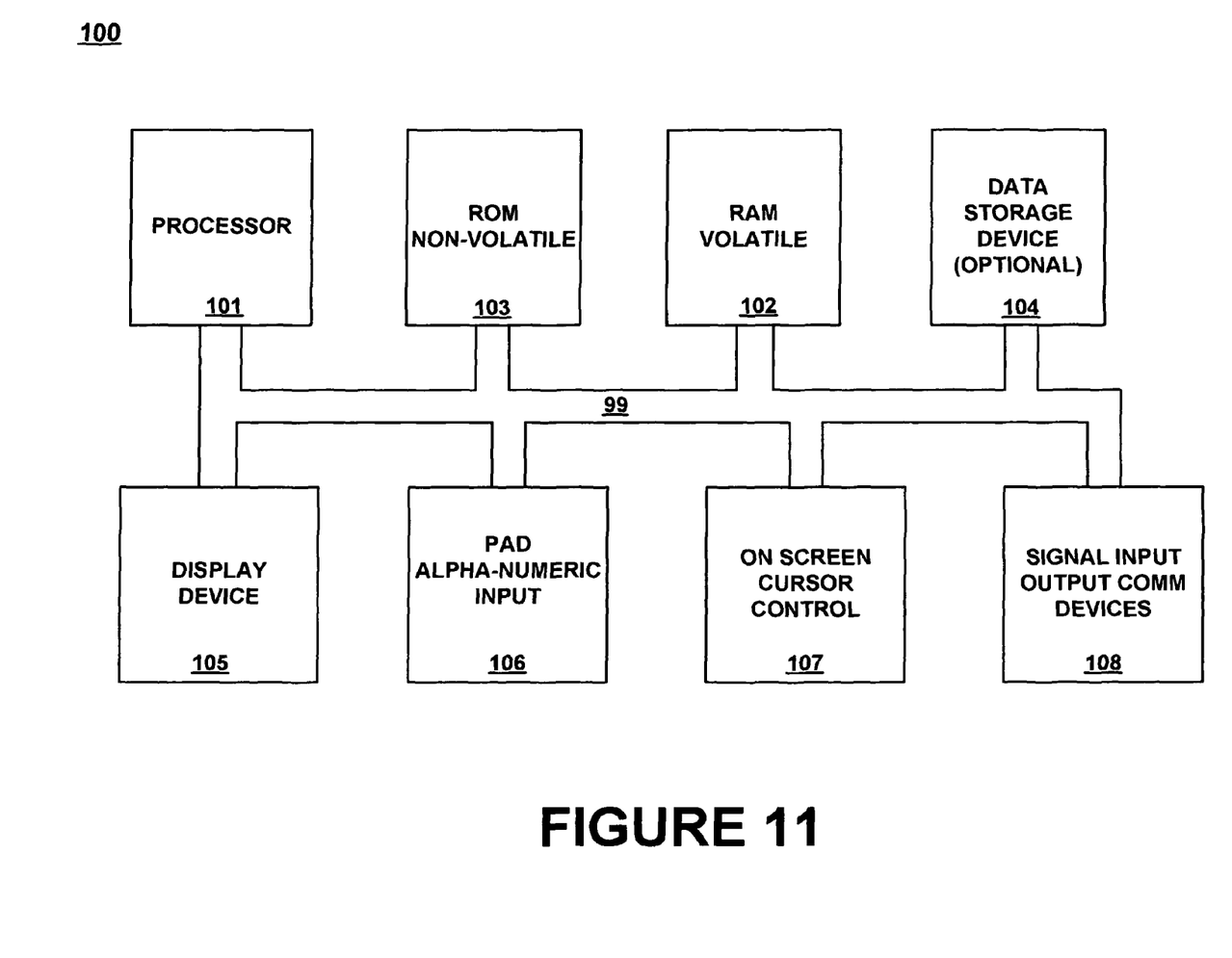
FIG. 11 is an exemplary computer system that may serve as a platform upon which embodiments of the present invention may be executed.

FIG. 11 illustrates circuitry of an exemplary computer system 100, which may form a platform for embodiments of automatically generating transactional level bus simulation instructions from a formal bus protocol description. The bus compiler tool 120 of FIG. 1 may be implemented by computer system 100. Computer system 100 includes an address/data bus 99 for communicating information, a central processor 101 coupled with the bus for processing information and instructions, a volatile memory 102 (e.g., random access memory RAM) coupled with the bus 99 for storing information and instructions for the central processor 101 and a non-volatile memory 103 (e.g., read only memory ROM) coupled with the bus 99 for storing static information and instructions for the processor 101. Computer system 100 also includes an optional data storage device 104 (e.g., a magnetic or optical disk and disk drive) coupled with the bus 99 for storing information and instructions.

With reference still to FIG. 11 system 100 also includes an alphanumeric input device 106 including alphanumeric and function keys coupled to bus 99 for communicating information and command selections to central processor unit 101. System 100 also includes a cursor control device 107 coupled to bus 99 for communicating user input information and command selections to central processor unit 101. System 100 of the present embodiment also includes a display device 105 coupled to bus 99 for displaying information. A signal input/output communication device 108 coupled to bus 99 provides communication with external devices.

The preferred embodiment of the present invention, automatically generating transactional level bus simulation instructions from a formal bus protocol description is thus described. While the present invention has been described in particular embodiments, it should be appreciated that the present invention should not be construed as limited by such embodiments, but rather construed according to the below claims.

What is claimed is:

1. A method comprising:
generating transaction level bus simulation instructions by using a bus protocol comprising;
parsing the bus protocol to generate a description suitable to derive a finite state machine representative of the bus protocol; and
generating the finite state machine by using the description; and
generating a synchronous finite state machine by using the description; and
generating an optimized finite state machine by using the synchronous finite state machine; and
generating an asynchronous finite state machine by using the optimized finite state machine; and
generating hypercubes, where a given hypercube describes possible sequences of events associated with a single transition in the optimized finite sate machine; and
generating the transaction level bus simulation instructions by using the asynchronous finite state machine; and
simulating a plurality of different designs for a bus by executing the same transaction level bus simulating instructions 2. The method of claim 1, wherein the generating the finite state machine comprises:
annotating the synchronous finite state machine with values to indicate positions of events in a pipeline.

3. A non-transitory computer-readable storage device including computer-executable instruction sorted therein, the computer-executable instructions comprising:
instructions to generate transaction level bus simulation instructions by using a bus protocol comprising;
instructions to parse the bus protocol to generate a description suitable to derive a finite state machine representative of the bus protocol; and
instructions to generate the finite state machine by using the description; and
instructions to generate a synchronous finite state machine by using the description; and
instructions to generate an optimized finite state machine by using the synchronous finite state machine; and
instructions to generate an asynchronous finite state machine by using the optimized finite state machine; and
instructions to generate hypercubes, where a given hypercube describes possible sequences of events associated with a single transition in the optimized finite sate machine; and
instructions to generate the transaction level bus simulation instructions by using the asynchronous finite state machine; and
instructions to simulate a plurality of different designs for a bus by executing the same transaction level bus simulating instructions.

4. The computer-readable storage device of claim 3, wherein the instructions to generate the finite state machine comprise:
instructions to annotate the finite state machine with values to indicate positions of events in a pipeline.

5. A device comprising:
a memory including a plurality of instructions; and
a processor operable to execute the instructions to generate transaction level bus simulation instructions by using a bus protocol; and
the processor is further operable to execute the instructions to parse the bus protocol to generate a description suitable to derive a finite state machine repressive of the bus protocol; and
the processor is further operable to execute the instructions to generate the finite state machine by using the description; and
the processor is further operable to execute the instructions to generate a synchronous finite state machine by using the description, and wherein the processor is operable to execute the instructions to generate an optimized finite state machine by using the synchronous finite state machine; and
the processor is further operable to execute the instruction to generate a synchronous finite stat machine by using the description, and wherein the processor is operable to execute the instruction to generate an optimized finite sate machine by using the synchronous finite state machine; and
the processor is further operable to execute the instructions to generate an asynchronous finite state machine by using the optimized finite state machine; and
the processor is further operable to execute the instructions to generate hypercubes, wherein a given hypercube describes possible sequences of events associated with a single transition in the optimized finite state machine; and wherein the processor is operable to execute the instructions to generate the transaction level bus simulation instructions by using the asynchronous finite state machine; and wherein the processor is operable to execute the instructions to simulate a plurality of different designs for a bus by executing same transaction level bus simulation instructions.

6. The device of claim 5, wherein the processor is operable to execute the instructions to annotate the synchronous finite state machine with values to indicate positions of events in a pipeline.

\* \* \* \* \*